(12) United States Patent
Kitamura et al.

(10) Patent No.: US 7,713,783 B2
(45) Date of Patent: May 11, 2010

(54) ELECTRONIC COMPONENT PACKAGE, ELECTRONIC COMPONENT USING THE PACKAGE, AND METHOD FOR MANUFACTURING ELECTRONIC COMPONENT PACKAGE

(75) Inventors: Makoto Kitamura, Omihachiman (JP); Nihei Kaishita, Omihachiman (JP); Takeshi Takeda, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 346 days.

(21) Appl. No.: 11/942,203

(22) Filed: Nov. 19, 2007

(65) Prior Publication Data

US 2008/0073739 A1     Mar. 27, 2008

Related U.S. Application Data

(63) Continuation of application No. PCT/JP2006/309911, filed on May 18, 2006.

(30) Foreign Application Priority Data

May 26, 2005    (JP) ............................ 2005-154252

(51) Int. Cl.
*H01L 21/00*     (2006.01)
(52) U.S. Cl. ............... 438/112; 257/433; 257/E31.131; 438/64
(58) Field of Classification Search ................. 257/433, 257/E31.131; 438/64, 110, 111, 112
See application file for complete search history.

(56) References Cited

U.S. PATENT DOCUMENTS

| | | | |
|---|---|---|---|
| 4,680,617 A * | 7/1987 | Ross | ........................ 257/795 |
| 5,650,659 A | 7/1997 | Mostafazadeh et al. | |
| 6,686,653 B2 * | 2/2004 | Jerominek et al. | .......... 257/680 |

FOREIGN PATENT DOCUMENTS

| | | |
|---|---|---|
| JP | 64-48450 | 2/1989 |
| JP | 1-138739 | 5/1989 |
| JP | 3-270178 | 12/1991 |

(Continued)

OTHER PUBLICATIONS

Written Opinion with English language translation.

(Continued)

*Primary Examiner*—Leonardo Andújar
(74) *Attorney, Agent, or Firm*—Keating & Bennett, LLP

(57) ABSTRACT

An electronic component package that provides a high shielding performance and that can prevent failures such as short-circuiting with a component contained therein. A package includes a shield case formed of a metal plate and shaped to have a bottom portion, the bottom portion having a through hole; a resin case molded on inner and outer surfaces of the shield case and shaped to have a bottom portion; and a hot terminal that is insert-molded in the resin case such that the hot terminal is inserted into the shield case through the through hole without contact. One end of the hot terminal is exposed at an inner surface of the resin case, and the other end of the hot terminal is exposed at an outer surface of the resin case. An element contained in the package is surrounded by the shield case so that good shielding performance is obtained.

1 Claim, 6 Drawing Sheets

FOREIGN PATENT DOCUMENTS

| | | |
|---|---|---|
| JP | 4-28446 | 3/1992 |
| JP | 4-82254 | 3/1992 |
| JP | 4-286193 | 10/1992 |
| JP | 6-275741 | 9/1994 |
| JP | 7-321254 | 12/1995 |
| JP | 11-176992 | 7/1999 |
| JP | 2002-299879 | 10/2002 |
| JP | 2003-115578 | 4/2003 |
| JP | 2005-123237 | 5/2005 |

OTHER PUBLICATIONS

International Search Report issued Jul. 18, 2006.

* cited by examiner

ELECTRONIC COMPONENT PACKAGE, ELECTRONIC COMPONENT USING THE PACKAGE, AND METHOD FOR MANUFACTURING ELECTRONIC COMPONENT PACKAGE

CROSS-REFERENCE TO RELATED APPLICATIONS

This is a continuation under 35 U.S.C. §111(a) of PCT/JP2006/309911 filed May 18, 2006, and claims priority of JP2005-154252 filed May 26, 2005, incorporated by reference.

BACKGROUND

1. Technical Field

The present disclosure relates to the structure of an electronic component package including a shield case formed by insert-molding and a method for manufacturing the electronic component package.

2. Background Art

In general, as described in Patent Document 1, a terminal-integrated package in which control signal terminals are integrally insert-molded in a resin case is generally used as an electronic component package. An electronic component contained in the package is a semiconductor device in which a main circuit block and a control circuit block are mounted in the terminal-integrated package in which the control signal terminals are integrally insert-molded in the resin case. In a method for manufacturing the terminal-integrated package, a lead frame having a plurality of control signal terminals that are connected to each other with tie bars is disposed such that outer lead portions of the control signal terminals extend out from between opposing surfaces of an upper die and a lower die of a mold for forming the resin case. Insert molding is performed in this state, and then the tie bars are cut. The main circuit block and the control circuit block are assembled into the thus-obtained terminal-integrated package, and wire bonding is performed. Thus, the semiconductor device is obtained. However, since the package does not have a shield case, there is a problem that the semiconductor device is not very resistant to noise.

Patent Documents 2 and 3 describe electronic component packages having shield structures.

Patent Document 2 describes an electronic component including a circuit substrate obtained by mounting a circuit component on an insulating substrate and a shield case attached to the circuit substrate so as to cover the circuit component. The shield case is formed by bending a hoop material and is arranged so as to cover the circuit substrate.

However, in this package structure, the bottom side of the circuit substrate is not shielded. Therefore, the electronic component is not very resistant to noise. In addition, since the circuit component is simply mounted on the top surface of the plate-shaped circuit substrate, there is a risk that solder will flow over the circuit substrate during reflow soldering and the circuit component will become short-circuited with the shield case.

FIG. 5 of Patent Document 3 shows a structure in which a plurality of L-shaped hot terminals are insert-molded in a side edge portion of a molded resin body and a metal shield plate is insert-molded in a bottom portion of the molded resin body. A metal shield case is provided so as to cover the molded resin body from above. The shield case is connected to a ground terminal extending from the shield plate, so that the overall body can be shielded. This structure is advantageous in that the bottom side of the molded resin body can be reliably shielded by the shield plate, and the hot terminals and the shield plate can be insert-molded together. However, since the hot terminals are near the shield case, there is a risk that the hot terminals will be short-circuited with the shield case due to flowing of solder in the assembly process.

Patent Document 1: Japanese Unexamined Patent Application Publication No. 11-176992

Patent Document 2: Japanese Unexamined Patent Application Publication No. 2002-299879

Patent Document 3: Japanese Unexamined Patent Application Publication No. 4-286193

SUMMARY

Accordingly, an embodiment disclosed herein is an electronic component package that has a high shielding performance and that can prevent failures such as short-circuiting with a component contained therein. Also disclosed is an electronic component using the electronic component package. Also disclosed is a method for manufacturing an electronic component package by which the package can be efficiently manufactured at a high accuracy.

According to a first embodiment, an electronic component package includes a shield case formed of a metal plate and shaped to have a bottom portion, the bottom portion having a through hole; a resin case molded on inner and outer surfaces of the shield case and shaped to have a bottom portion; and a hot terminal that is insert-molded in the resin case such that the hot terminal is inserted into the shield case through the through hole without contact, one end of the hot terminal is exposed at an inner surface of the resin case, and the other end of the hot terminal is exposed at an outer surface of the resin case.

According to a second embodiment, an electronic component includes the electronic component package according to the first embodiment and an electronic component element contained in the resin case, the electronic component element having an electrode portion connected to the one end of the hot terminal exposed at the inner surface of the resin case, an opening portion of the package being closed with a shield cover.

According to a third embodiment, a method for manufacturing an electronic component package includes a step of preparing a first lead frame on which a shield case shaped to have a bottom portion having a through hole is integrally formed, the first lead frame having a burring portion in a region outside the shield case; a step of preparing a second lead frame on which a hot terminal is integrally formed; a step of placing the first lead frame and the second lead frame on top of each other such that the hot terminal is inserted into the shield case through the through hole without contact, crimping a tie bar used for connecting the hot terminal to a runner in the second lead frame so as to fix the tie bar to the burring portion of the first lead frame, and removing the tie bar from the second lead frame; a step of inserting the first lead frame and the tie bar having the terminal and fixed to the first lead frame by crimping into a mold, and molding inner and outer surfaces of the shield case with resin to form a resin case such that one end of the hot terminal is exposed at the inner surface of the resin case and the other end of the hot terminal is exposed at the outer surface of the resin case; and a step of obtaining the package by removing only the hot terminal from the tie bar after molding.

In the electronic component package according to the first embodiment, the shield case shaped to have a bottom portion is insert-molded in the resin case, and a hot terminal is also insert-molded in the resin case. The inner and outer surfaces of the shield case are almost entirely covered by resin. The hot terminal is inserted into the shield case through the through hole formed in the bottom portion of the shield case without contact. One end of the hot terminal is exposed at the inner surface of the resin case, and the other end of the hot terminal is exposed at the outer surface of the second end. Therefore, the one end of the hot terminal is positioned above the bottom portion of the shield case, and the other end of the hot terminal is positioned below the bottom portion of the shield case.

When the electronic component element is mounted in the package, the bottom and side surfaces of the electronic component element are surrounded by the shield case. Therefore, high shielding performance can be obtained. In addition, since the inner side of the shield case is covered with resin, the risk that the electronic component element will be short-circuited by the shield case can be reduced. In addition, since the resin case is shaped to have a bottom portion, in other words, since the resin case has side walls, the solder flow can be prevented in the assembly process.

In addition, since the hot terminal is inserted through the through hole formed in the bottom portion of the shield case, the hot terminal can be led out from the case, while the shielding performance is hardly reduced. In addition, the hot terminal and the shield case are insert-molded together while the positional relationship therebetween is maintained. Therefore, the number of manufacturing steps and the manufacturing cost can be reduced. In addition, since the resin is supplied between the hot terminal and the shield case, the risk that the hot terminal and the shield case will come into contact with each other can be eliminated.

In another embodiment, a top edge portion of the shield case is partially or entirely exposed from the resin case, a shield cover is attached to a top edge portion of the resin case, and the shield cover is electrically connected to the top edge portion of the shield case. In such a case, all of the six sides of the electronic component element contained in the case are surrounded by the shield case and the shield cover. Therefore, the shielding performance can be further improved.

In another embodiment, the shield case has an outer terminal formed by cutting the bottom portion of the shield case so as to project outward, the outer terminal being partially exposed at the outer surface of the resin case. In the case in which an outer terminal for connecting the shield case to a ground potential is to be formed integrally with the shield case, the outer terminal can be easily formed by cutting the bottom portion of the shield case so as to project outward.

In another embodiment, the shield case has an inner terminal formed by cutting the bottom portion of the shield case so as to protrude inward, the inner terminal being partially exposed at the inner surface of the resin case. In such a case, the electronic component element can be easily connected to the ground potential through the shield case by connecting a ground portion of the electronic component element mounted in the resin case to the inner terminal.

In the case in which the electronic component element contained in the resin cases is an infrared sensor, a part or the entirety of the shield cover is preferably made of Si. Si plates allow infrared rays to pass therethrough, and have conductivity. Therefore, Si plates are capable of reliably shielding external electromagnetic noise. Therefore, all six sides of the infrared sensor can be shielded and an infrared sensor with high noise resistance can be obtained.

If the infrared sensor is covered with a metal shield cover from above, it is necessary to form a hole for sensing in the shield cover, which leads to reduction in the shielding performance. As a result, the sensing area is limited to a small area by the diameter of the hole. In comparison, if the overall body of the shield cover is made of Si, it is not necessary to form a hole for sensing in the shield cover and the sensing area can be increased. In addition, the shielding performance can be ensured.

An electronic component package can be efficiently manufactured with high accuracy by using the method for manufacturing the electronic component package of the third embodiment. More specifically, a first lead frame on which a shield case is integrally formed is prepared, and a second lead frame on which a hot terminal is integrally formed is placed on top of the first lead frame. Then, a tie bar used for connecting the hot terminal to a runner in the second lead frame is fixed to the first lead frame by crimping, and then the tie bar is removed from the second lead frame. In the crimping process, the hot terminal is inserted into the shield case through the through hole in the bottom portion of the shield case without contact. The first lead frame is provided with a burring portion to be fixed by the crimping process. Next, the first lead frame that is fixed by crimping and the tie bar including the hot terminal are inserted in the mold and are resin-molded. Accordingly, the shield case and the hot terminal are insert-molded simultaneously. One end of the hot terminal is exposed at the inner surface of the resin case formed by resin molding, and the other end of the hot terminal is exposed at the outer surface of the resin case. After the resin molding process, only the hot terminal is removed from the tie bar. Thus, the package is obtained.

In the above-described method, a portion (tie bar) around the hot terminal is fixed to the first lead frame by crimping. The shield case and the hot terminal are inserted into the mold while the positional relationship therebetween is maintained, and are insert-molded. As a result, an electronic component package can be efficiently manufactured with high accuracy.

As described above, according to the disclosed, resin is molded on inner and outer surfaces of the shield case having a bottom portion. Therefore, an electronic component element contained in the package can be shielded with high shielding performance and the shield case can be prevented from becoming short-circuited with the electronic component element contained therein. The shield case and the hot terminal are insert molded while the positional relationship therebetween is maintained so that the hot terminal is inserted into the shield case through the through hole without contact, one end of the hot terminal is exposed at the inner surface of the resin case, and the other end of the hot terminal is exposed at the outer surface of the resin case. Therefore, the shield case is prevented from becoming short-circuited with the hot terminal. In addition, the hot terminal connected to the electronic component element accommodated in the resin case can be reliably lead out of the shield case.

Other features and advantages will become apparent from the following description of embodiments which refers to the accompanying drawings.

DETAILED DESCRIPTION

First Embodiment

Figure 1:
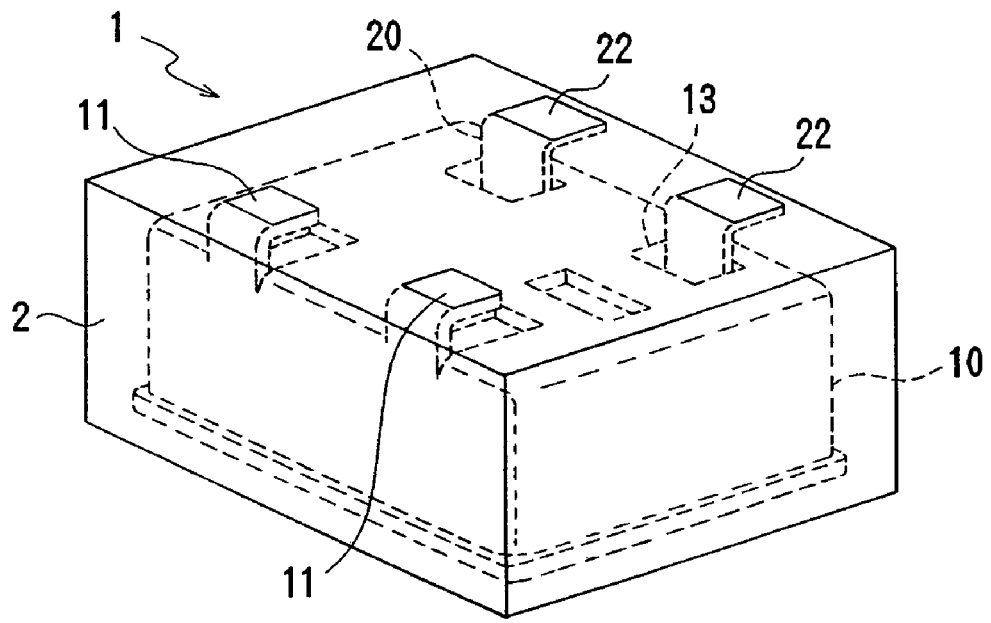
FIG. 1 is a perspective bottom view of an example of an electronic component package according to the present invention.
Figure 2:
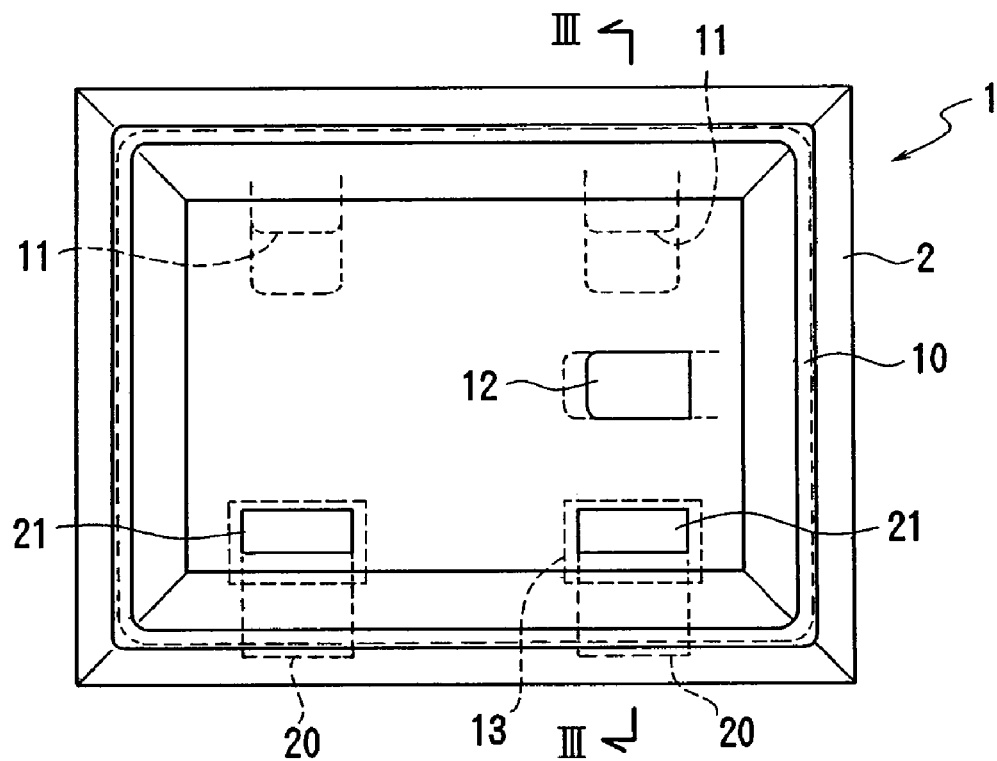
FIG. 2 is a plan view of the electronic component package shown in FIG. 1.
Figure 3:
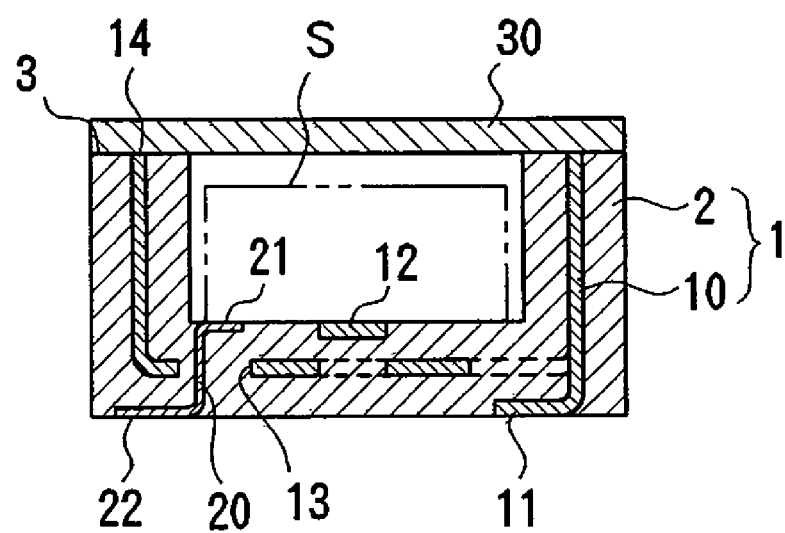
FIG. 3 is a sectional view of FIG. 2 taken along line III-III.

FIGS. 1 to 3 illustrate an example of an electronic component.

In this example, the electronic component is a surface-mount infrared sensor device. The sensor device includes a package 1 that is shaped to have a bottom portion (cup-like shape), an infrared sensor S accommodated in the package 1, and a shield cover 30 attached to a top edge portion of the package 1.

The package 1 includes a resin case 2, a shield case 10, and a plurality of (two in this example) hot terminals 20. The shield case 10 and the hot terminals 20 are insert-molded in the resin case 2. The shield case 10 is made of a metal plate and is shaped to have a bottom portion (cup-like shape). Inner and outer surfaces of the shield case 10 are covered with the resin 2. Two outer terminals 11 formed by cutting the bottom portion of the shield case 10 so as to project downward are arranged along a long side of the bottom portion, and a single inner terminal 12 formed by cutting the bottom portion of the shield case 10 so as to project upward is arranged near a short side of the bottom portion. The outer terminals 11 are exposed at an outer surface of a bottom portion of the resin case 2 and the inner terminal 12 is exposed at an inner surface of the bottom portion of the resin case 2. The shield case 10 has two through holes 13 in the bottom portion thereof at positions along the long side where the through holes 13 oppose the respective outer terminals 11. In the present embodiment, a top edge portion 14 of the shield case 10 is exposed at a top edge portion 3 of the resin case 2. However, it is not necessary that the top edge portion 14 be exposed.

The hot terminals 20 are bent in a crank-shape, and are inserted through the through holes 13 formed in the shield case 10 without contact. A first end 21 of each hot terminal 20 is exposed at the inner surface of the bottom portion of the resin case 2, and a second end 22 of each hot terminal 20 is exposed at the outer surface of the bottom portion of the resin case 2. Thus, each of the hot terminals 20 is three-dimensionally arranged such that the first and second ends 21 and 22 thereof are disposed at different heights relative to the bottom portion of the shield case 10.

The infrared sensor S is contained in the package 1 such that a sensing surface thereof faces upward. The infrared sensor S has input/output electrodes that are connected to the first ends 21 of the hot terminals 20 exposed at the inner surface of the bottom portion of the resin case 2 and a ground electrode that is connected to the inner terminal 12 of the shield case 10. The open top of the package 1 is covered by the shield cover 30. In the present embodiment, the shield cover 30 is formed of Si, which allows infrared rays to pass therethrough but absorbs electromagnetic noise. The shield cover 30 is electrically connected to the top edge portion 14 of the shield case 10 that is exposed at the top edge portion 3 of the resin case 2. Therefore, the shield cover 30 is electrically connected to the ground potential through the outer terminals 11 together with the shield case 10.

As described above, six sides around the infrared sensor S are almost entirely covered by the shield case 10 and the shield cover 30. Therefore, a good shielding performance can be obtained. If the sensing surface of the infrared sensor S is formed of Si, it is not necessary to form a hole for sensing in the shield cover 30. Therefore, a large sensing area can be obtained and the shielding performance can be ensured.

The material of the shield cover 30 is not limited to Si. For example, the shield cover 30 may also be a metal plate having a sensing hole formed therein.

Next, a method for manufacturing the package 1 having the above-described structure will be described with reference to FIGS. 4 to 6.

Figure 4:
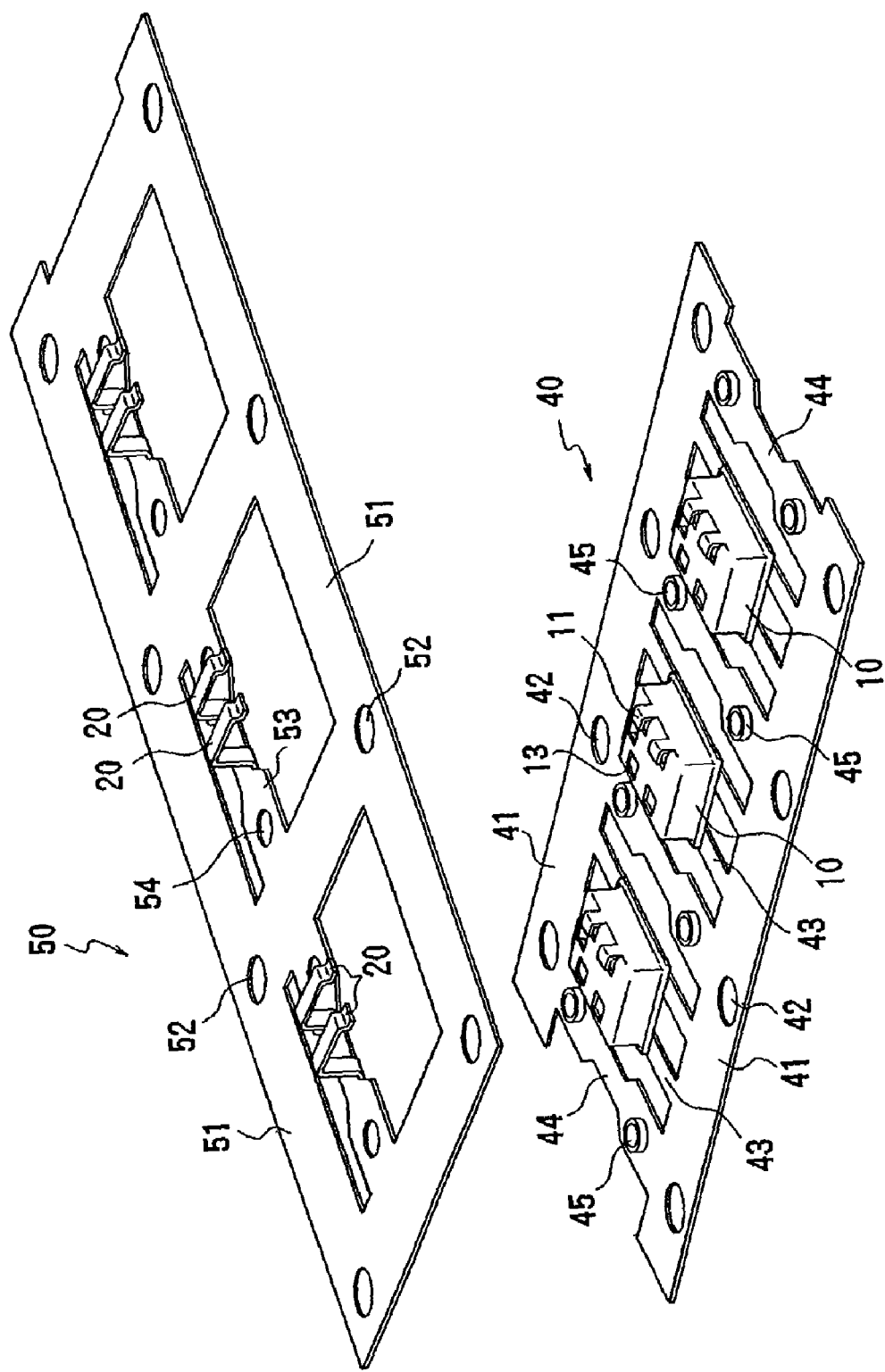
FIG. 4 is a perspective view of lead frames having shield cases and hot terminals provided thereon for manufacturing electronic component packages.
Figure 5:
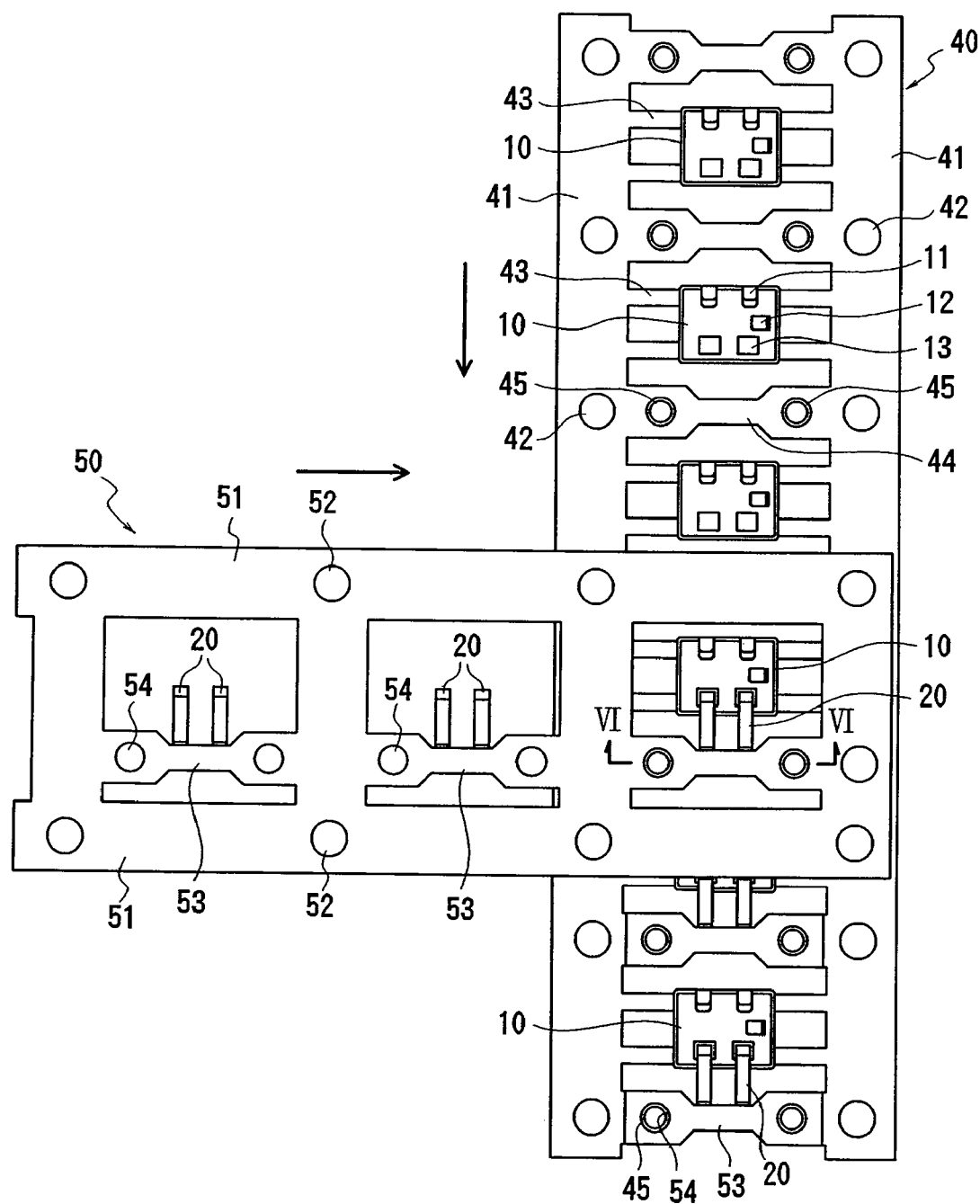
FIG. 5 is a plan view of the lead frames shown in FIG. 4.

FIGS. 4 and 5 illustrate a first lead frame 40 on which shield cases 10 are integrated and a second lead frame 50 on which hot terminals 20 are integrated. The first lead frame 40 is punched out of a hoop material and has band-shaped runners 41 on either side thereof. Each runner 41 has pilot holes 42 formed therein at constant intervals. The shield cases 10 are connected between the runners 41 by tie bars 43. The shield cases 10 are formed by deep drawing, and each shield case 10 has the outer terminals 11, the inner terminal 12, and the through holes 13 at the bottom portion thereof. The runners 41 are connected to each other by other tie bars 44. Each of the tie bars 44 has a plurality of (two in this example) burring portions 45.

The second lead frame 50 is also punched out of a hoop material and has band-shaped runners 51 on either side thereof. Each runner 51 has pilot holes 52 formed therein at constant intervals. The hot terminals 20 are formed integrally with the runners 51 with tie bars 53 provided therebetween. Each tie bar 53 has fitting holes 54 that correspond to the above-mentioned burring portions 45.

Figure 6:
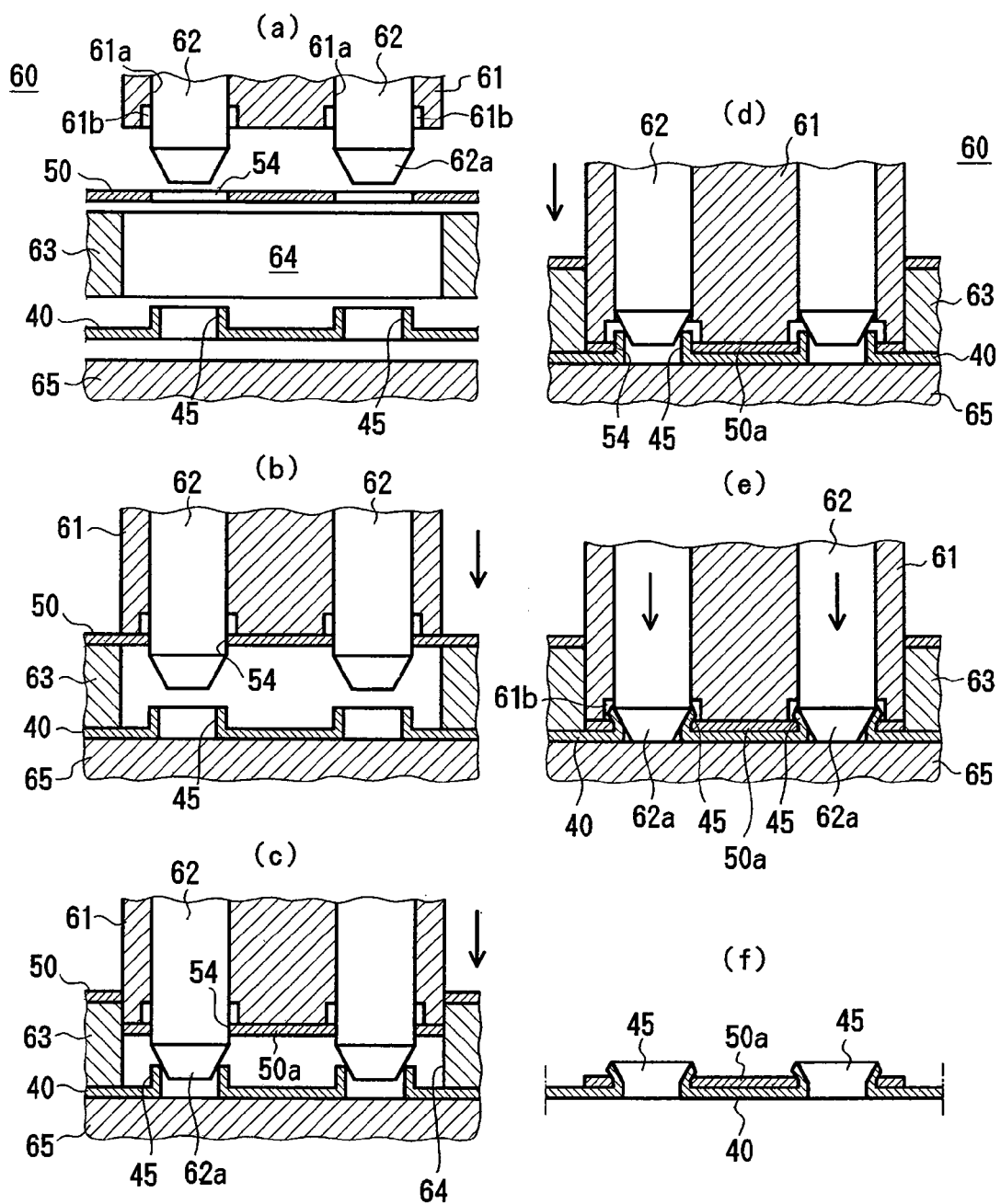
FIG. 6 is a manufacturing process diagram showing a cutting-and-crimping device taken along line VI-VI in FIG. 5.

The first lead frame 40 and the second lead frame 50 are arranged perpendicular to each other, as shown in FIG. 5, and are fixed to each other by a crimping die 60 shown in FIG. 6. The crimping die 60 includes a first die (punch) 61 having positioning pins 62, a second die (die) 63 having an opening hole 64 into which the first die 61 is inserted, and a third die 65 that supports a bottom surface of the first lead frame 40. The diameter of the positioning pins 62 is equal to or slightly larger than the outer diameter of the burring portions 45, and a tapered surface 62a is provided at a tip of each positioning pin 62. The positioning pins 62 are inserted into insertion holes 61a formed in the first die 61 such that the positioning pins 62 can move vertically. Annular grooves 61b for receiving the burring portions 45 after crimping are formed at the bottom edges of the through holes 61a.

As shown in FIG. 6(*a*), first, the second lead frame 50 is disposed between the first die 61 and the second die 63 and the first lead frame 40 is disposed between the second die 63 and the third die 65. Next, the first die 61 is moved downward, so that the second lead frame 50 is pressed between the first die 61 and the second die 63 and the first lead frame 40 is pressed between the second die 63 and the third die 65, as shown in FIG. 6(*b*). The positioning pins 62 are inserted through the fitting holes 54 in the second lead frame 50, so that the second lead frame 50 is positioned relative to the first die 61. The first die 61, the second die 63, the third die 65, and the first lead frame 40 are positioned relative to one another by positioning means (not shown).

When the first die 61 is moved downward, as shown in FIG. 6(*c*), a portion 50a of the second lead frame 50 is cut off by the first die 61 and the second die 63 and is moved downward in the opening hole 64 together with the first die 61. The cut portion 50a is moved downward while the positioning pins 62 are inserted in the fitting holes 54 and is therefore prevented from being displaced. The tapered surfaces 62a at the tips of the positioning pins 62 engage with the respective burring portions 45 on the first lead frame 40.

When the first die 61 is moved further downward, as shown in FIG. 6(d), the fitting holes 54 in the cut portion 50a are guided by the positioning pins 62 and are fitted to the burring portions 45. Then, the cut portion 50a comes into close contact with the first lead frame 40 by being pressed by the first die 61.

Then, only the positioning pins 62 are moved downward. Accordingly, as shown in FIG. 6(e), each burring portion 45 is crimped such that the burring portion 45 spreads outward and a portion of the burring portion 45 enters the corresponding annular groove 61b in the first die 61. Thus, the cut portion 50a is fixed to the first lead frame 40.

Figure 7:
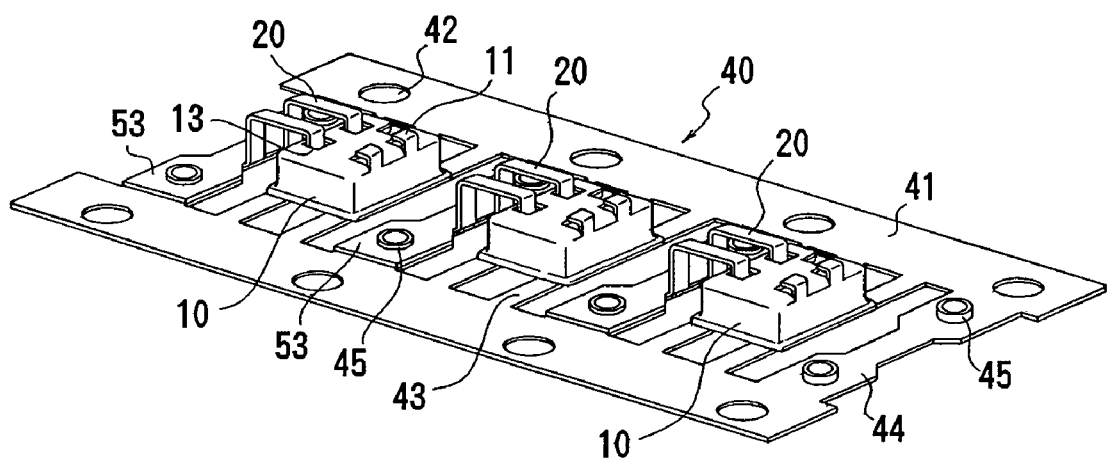
FIG. 7 is a perspective view illustrating a lead frame after a cutting-and-crimping step.

Then, the first to third dies 61, 63, and 65 are removed from one another. As a result, as shown in FIG. 6(f), a first lead frame 40 on which the cut portion 50a is fixed by crimping is obtained. FIG. 7 shows the first lead frame 40 on which a plurality of cut portions 50a are fixed by crimping. Referring to FIG. 7, each cut portion 50a is obtained by removing the tie bar 53 and the hot terminals 20 from the second lead frame 50 while the tie bar 53 and the hot terminals 20 are integrally connected with each other. Therefore, the first end portions 21 of the hot terminals 20 are inserted into the respective through holes 13 in the shield case 10 without contact.

Then, the first lead frame 40 to which the hot terminals 20 are connected is set in a mold, and insert molding is performed. The tie bars 43 with which the hot terminals 20 and each shield case 10 are connected to the first lead frame 40 are cut by suitable means after or during insert molding. As a result, the package 1 shown in FIGS. 1 to 3 is obtained.

As described above, in the process of insert-molding a composite component including the shield case 10 and the hot terminals 20, the shield case 10 and the hot terminals 20 are supplied on the corresponding lead frames (hoop material). Then, the shield case 10 and the hot terminals 20 are fixed by crimping, and are inserted in a mold while the relative relationship therebetween is maintained, so that the parts are prevented from being separated from one another. As a result, the productivity is improved and the dimensional accuracy can be easily increased. In addition, the burring portions 45 are provided on the first lead frame 40 and are fitted to the fitting holes 54 in the second lead frame 50 for crimping. Therefore, a component dedicated to fixing is not necessary, which leads to cost reduction.

In the above-described embodiment, the outer terminals 11 and the inner terminal 12 are formed integrally with the shield case 10 by cutting the shield case 10 so as to project therefrom. However, these terminals may be also be omitted. Alternatively, in place of the outer terminals 11 and the inner terminal 12, other terminals may be fixed to the shield case 10. In addition, an electronic component element to be contained in the package according to the present invention is not limited to the infrared sensor, and various kinds of electronic components can be used.

Although particular embodiments have been described, many other variations and modifications and other uses will become apparent to those skilled in the art. Therefore, the present invention is not limited by the specific disclosure herein.

What is claimed is:

1. A method for manufacturing an electronic component package, comprising the steps of:
    preparing a first lead frame on which a shield case shaped to have a bottom portion having a through hole is integrally formed, the first lead frame having a burring portion in a region outside the shield case;
    preparing a second lead frame on which a hot terminal is integrally formed;
    placing the first lead frame and the second lead frame such that the hot terminal is inserted into the shield case through the through hole without contact, crimping a tie bar used for connecting the hot terminal to a runner in the second lead frame so as to fix the tie bar to the burring portion of the first lead frame, and removing the tie bar from the second lead frame;
    inserting the first lead frame and the tie bar having the terminal and fixed to the first lead frame by crimping into a mold, and molding inner and outer surfaces of the shield case with resin to form a resin case such that one end of the hot terminal is exposed at the inner surface of the resin case and the other end of the hot terminal is exposed at the outer surface of the resin case; and
    obtaining the package by removing only the hot terminal from the tie bar after molding.

* * * * *